US012763547B2

(12) United States Patent
Kozuru

(10) Patent No.: US 12,763,547 B2
(45) Date of Patent: Oct. 13, 2026

(54) LIGHT EMITTING DEVICE, METHOD OF MANUFACTURING A LIGHT EMITTING DEVICE, AND METHOD OF MANUFACTURING A SUBMOUNT

(71) Applicant: NICHIA CORPORATION, Anan (JP)

(72) Inventor: Kazuma Kozuru, Anan (JP)

(73) Assignee: Nichia Corporation, Anan (JP)

( * ) Notice: Subject to any disclaimer, the term of this patent is extended or adjusted under 35 U.S.C. 154(b) by 881 days.

(21) Appl. No.: 18/060,859

(22) Filed: Dec. 1, 2022

(65) Prior Publication Data

US 2023/0187898 A1 Jun. 15, 2023

(30) Foreign Application Priority Data

Dec. 14, 2021 (JP) ................................ 2021-202660

(51) Int. Cl.
*H01S 5/02315* (2021.01)
*H01S 5/02218* (2021.01)
*H01S 5/024* (2006.01)

(52) U.S. Cl.
CPC ...... *H01S 5/02315* (2021.01); *H01S 5/02218* (2021.01); *H01S 5/02469* (2013.01); *H01S 5/02476* (2013.01)

(58) Field of Classification Search
CPC . H01L 23/26; H01S 5/02315; H01S 5/02218; H01S 5/02469; H01S 5/02476
See application file for complete search history.

(56) References Cited

U.S. PATENT DOCUMENTS 5,494,753 A 2/1996 Anthony
11,063,404 B1 * 7/2021 Kanskar ................ H01S 5/0653
2011/0007762 A1 1/2011 Fukuda et al.
2011/0014417 A1 * 1/2011 Lemak ................ H01L 23/3735 427/407.1
2011/0303399 A1 * 12/2011 Sakimichi ............. H01L 23/373 165/185
2013/0243020 A1 * 9/2013 Kim .................... H01S 5/02375 372/44.01

(Continued)

FOREIGN PATENT DOCUMENTS

CN 103887703 A * 6/2014
CN 106329308 A * 1/2017 ......... H01S 5/02469

(Continued)

*Primary Examiner* — James A Menefee
(74) *Attorney, Agent, or Firm* — Kim & Stewart LLP

(57) ABSTRACT

A light emitting device includes a submount, a semiconductor laser device, and a base supporting the submount. The submount includes a graphite layer having upper and lower surfaces extending in first and second directions orthogonal to each other and a support layer having upper and lower surfaces extending in the first and second directions. The graphite layer includes a plurality of graphene structures layered in the first direction. Each of the plurality of graphene structures extends in the second direction. The support layer is thicker than the graphite layer. The upper surface of the support layer supports the lower surface of the graphite layer. The semiconductor laser device emits laser light through an end surface in the first direction. The semiconductor laser device includes a waveguide that extends in the first direction and is supported by the upper surface of the graphite layer.

12 Claims, 11 Drawing Sheets

(56) References Cited

U.S. PATENT DOCUMENTS

| | | | | |
|---|---|---|---|---|
| 2017/0055365 | A1* | 2/2017 | Sanders | ................ H01L 23/373 |
| 2018/0145007 | A1 | 5/2018 | Hatano et al. | |
| 2020/0312739 | A1* | 10/2020 | Orimoto | ........... H01L 23/49568 |

FOREIGN PATENT DOCUMENTS

| | | | | |
|---|---|---|---|---|
| CN | 109244825 | A * | 1/2019 | ......... H01S 5/02469 |
| EP | 2792719 | A2 * | 10/2014 | ........... H01L 23/373 |
| JP | H08-191121 | A | 7/1996 | |
| JP | 2011-023670 | A | 2/2011 | |
| JP | 2012-238733 | A | 12/2012 | |
| JP | 2014-146727 | A | 8/2014 | |
| JP | 2014-154570 | A | 8/2014 | |
| JP | 2014-183156 | A | 9/2014 | |
| JP | 2014-197608 | A | 10/2014 | |
| JP | 2015-032706 | A | 2/2015 | |
| JP | 2015-179759 | A | 10/2015 | |
| JP | 2015-179766 | A | 10/2015 | |
| JP | 2015-191950 | A | 11/2015 | |
| JP | 2019-071399 | A | 5/2019 | |
| JP | 2021-072326 | A | 5/2021 | |
| WO | 2009/113180 | A1 | 9/2009 | |
| WO | WO-2019188614 | A1 * | 10/2019 | ........... H01L 23/373 |

* cited by examiner

LIGHT EMITTING DEVICE, METHOD OF MANUFACTURING A LIGHT EMITTING DEVICE, AND METHOD OF MANUFACTURING A SUBMOUNT

CROSS-REFERENCE TO RELATED APPLICATION

This application claims priority to Japanese Patent Application No. 2021-202660, filed on Dec. 14, 2021, the disclosure of which is hereby incorporated by reference in its entirety.

BACKGROUND

The present disclosure relates to a light emitting device, a method of manufacturing a light emitting device, and a method of manufacturing a submount.

A light emitting device can be used for devices such as processing machines, projectors, and illumination devices. A typical example of a light emitting device includes an edge-emission type semiconductor laser device, and a submount supporting the same. An edge-emission type semiconductor laser device includes a waveguide. When such a semiconductor laser device is operated, light that repeatedly reciprocates along the waveguide is generated and a portion of this light is emitted as laser light through one of the two end surfaces of the waveguide. The waveguide is likely to have a high thermal density during the operation; therefore, if the thermal conductivity of the submount is low, then the thermal resistance of the submount will be high. This may result in the semiconductor laser device having an excessive temperature increase, and the laser light having a poorer output power. Japanese Patent Publication No. 2011-023670 discloses an anisotropic heat-conducting element that includes a structural body in which graphene sheets are layered, this element having a high thermal conductivity in a certain direction.

SUMMARY

A light emitting device that allows for reducing a temperature increase in an edge-emission type semiconductor laser device, a method of manufacturing the same and a method of manufacturing a submount that allows a heat emitted from an edge-emission type semiconductor laser device to be efficiently propagated to the outside are provided.

In an embodiment, a light emitting device according to the present disclosure includes: a submount including: a graphite layer having an upper surface and a lower surface that extend in a first direction and a second direction which are orthogonal to each other, wherein the graphite layer includes a plurality of graphene structures that are layered in the first direction, each of the plurality of graphene structures extending in the second direction, and a support layer having an upper surface and a lower surface that extend in the first direction and in the second direction, the support layer being thicker than the graphite layer, the upper surface of the support layer supporting the lower surface of the graphite layer; a semiconductor laser device configured to emit laser light through an end surface in the first direction, the semiconductor laser device including a waveguide that extends in the first direction and is supported by the upper surface of the graphite layer; and a base supporting the submount.

In an embodiment, a method of manufacturing a submount according to the present disclosure includes: providing a stack in which a graphite layer and a support layer are layered, wherein the graphite layer extends in a first direction and a second direction which are orthogonal to each other, the graphite layer including a plurality of graphene structures that are layered in the first direction, each of the plurality of graphene structures extending in the second direction; and the support layer extends in the first direction and the second direction, the support layer being thicker than the graphite layer; forming a plurality of grooves in the stack, each of the grooves extending in the first direction or the second direction; and singulating the stack into a plurality of submounts along the plurality of grooves, each submount including a portion of the graphite layer and a portion of the support layer.

In an embodiment, a method of manufacturing a light emitting device according to the present disclosure includes, after the above method of manufacturing the submounts: providing, on the portion of the graphite layer included in each of the plurality of submounts, a semiconductor laser device configured to emit laser light through an end surface in the first direction, the semiconductor laser device including a waveguide that extends in the first direction.

According to certain embodiments of the present disclosure, it is possible to realize: a light emitting device that allows for reducing a temperature increase in an edge-emission type semiconductor laser device, and a method of manufacturing the same; and a method of manufacturing a submount that allows a heat generated by an edge-emission type semiconductor laser device to be efficiently propagated to the outside.

DETAILED DESCRIPTION

Figure 1A:
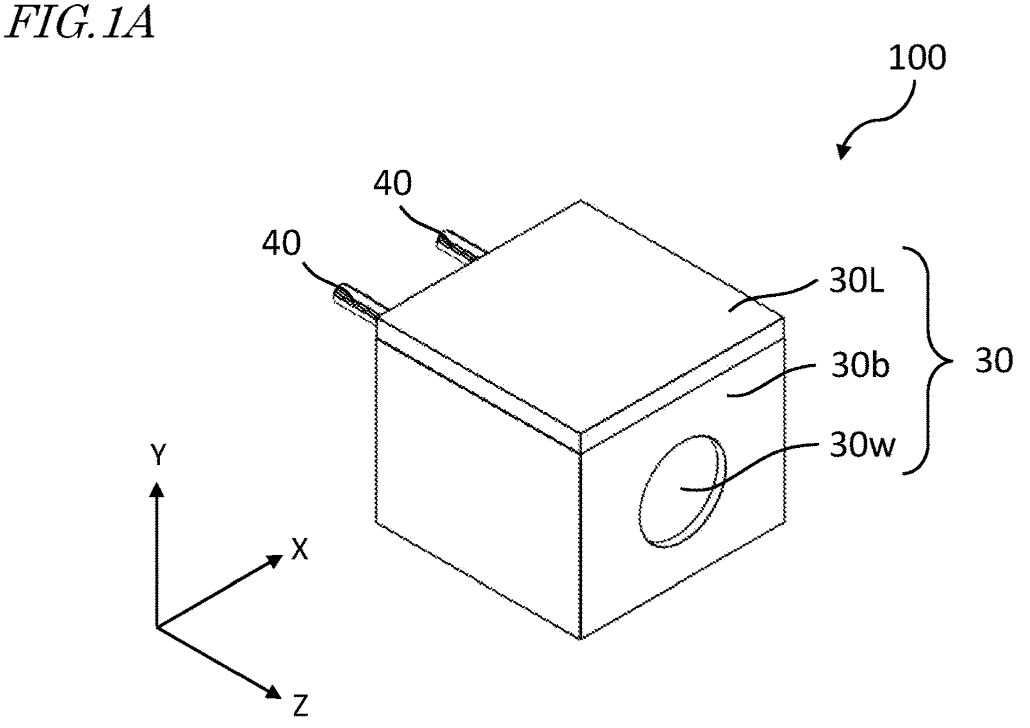
FIG. 1A schematically illustrates a perspective view of a light emitting device according to an illustrative embodiment of the present disclosure.

Hereinafter, with reference to the drawings, a light emitting device and a method of manufacturing the same, and a method of manufacturing a submount according to embodiments of the present disclosure will be described. The same reference characters in a plurality of drawings denote the same or similar elements.

Moreover, the embodiment and modified examples described below are intended to give a concrete form to the technical ideas of the present invention; the present invention is not limited thereto. The size, material, shape, relative arrangement, etc., of the component elements are intended as examples, and the scope of the present invention is not intended to be limited thereto. The size, arrangement relationship, etc., of the members shown in each drawing may be exaggerated in order to facilitate understanding.

In the specification and claims herein, moreover, when there are multiple pieces of a certain component and a distinction must be made, an ordinal such as “first,” “second,” or the like might occasionally be added. When the specification and the claims are based on different distinctions or standpoints, an element accompanied by the same ordinal might not refer to the same element between the specification and the claims.

Embodiments

Light Emitting Device

First, with reference to FIG. 1A to FIG. 2B, an example of a light emitting device according to an embodiment of the present disclosure will be described. FIG. 1A schematically illustrates a perspective view of a light emitting device according to an illustrative embodiment of the present disclosure. For reference sake, each drawing schematically shows an X axis, a Y axis, and a Z axis which are orthogonal to one another. The direction of an arrowhead shown for the X axis will be referred to as +X direction, whereas the opposite direction thereto will be referred to as −X direction. In the case where no distinction is needed between the ±X directions, these directions will simply be referred to as X direction. The same is also true of the ±Y directions and the ±Z directions. The coordinate axes do not limit the orientation of the light emitting device during use; the orientation of the light emitting device may be arbitrarily selected. In the present specification, the Z direction may be referred to as the “first direction,” and the X direction as the “second direction.”

The light emitting device 100 shown in FIG. 1A includes: an edge-emission type semiconductor laser device and a submount, which do not show themselves in the outer appearance; a package 30 housing these; and lead terminals 40 extending through the package 30 to supply power to the semiconductor laser device. The package 30 includes a lid 30L, a base 30*b*, and a window 30*w*.

Figure 1B:
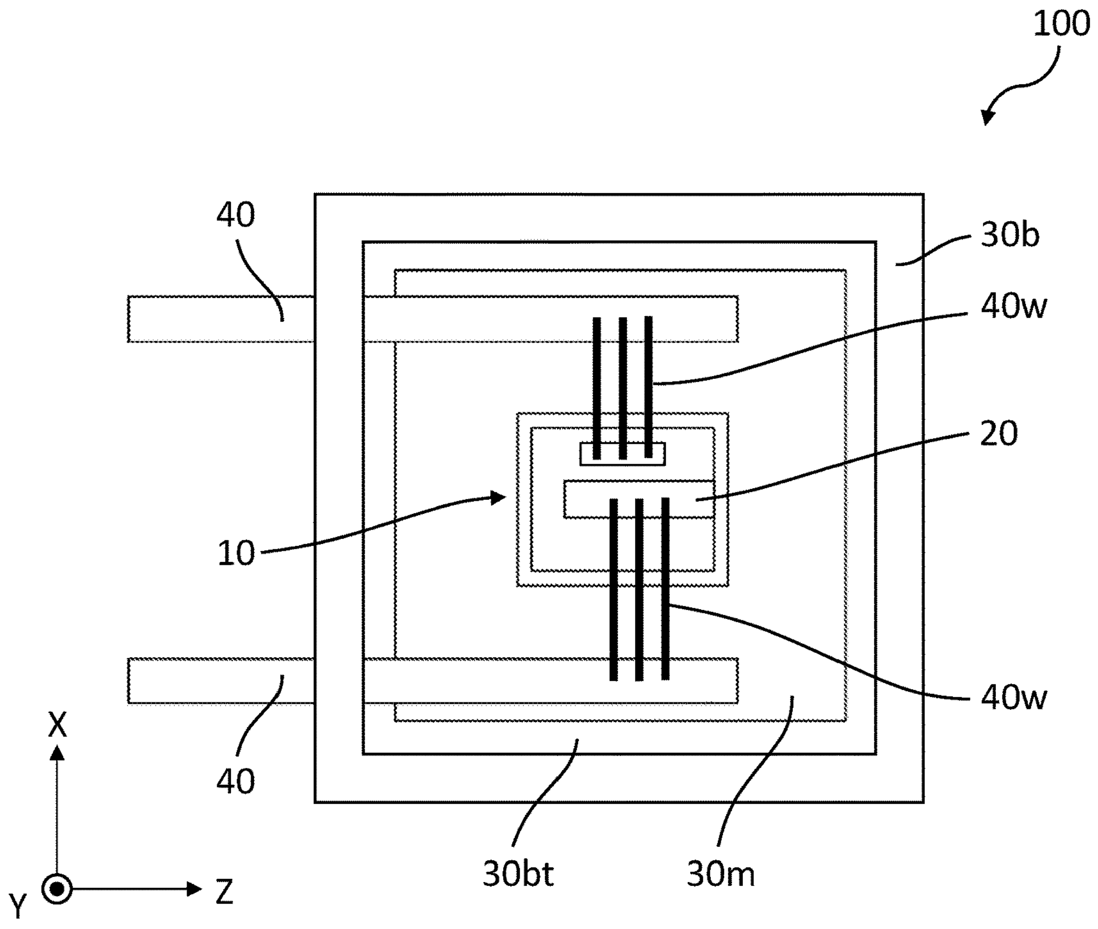
FIG. 1B schematically illustrates a top view of the light emitting device shown in FIG. 1A, showing an internal configuration of the light emitting device.

FIG. 1B schematically illustrates a top view of the light emitting device 100 shown in FIG. 1A, showing an internal configuration of the light emitting device 100. The lid 30L is omitted in FIG. 1B. As shown in FIG. 1B, inside the base 30*b*, the light emitting device 100 includes a submount 10, a semiconductor laser device 20, and wires 40*w*. The base 30*b* includes: a bottom plate portion that has an inner bottom surface 30*bt*; and a member 30*m* provided on the inner bottom surface 30*bt*. The member 30*m* of the base 30*b* supports the submount 10 either directly or indirectly via another member. Laser light emitted from the semiconductor laser device 20 is output to the outside through the window 30*w* shown in FIG. 1A.

Figure 2A:
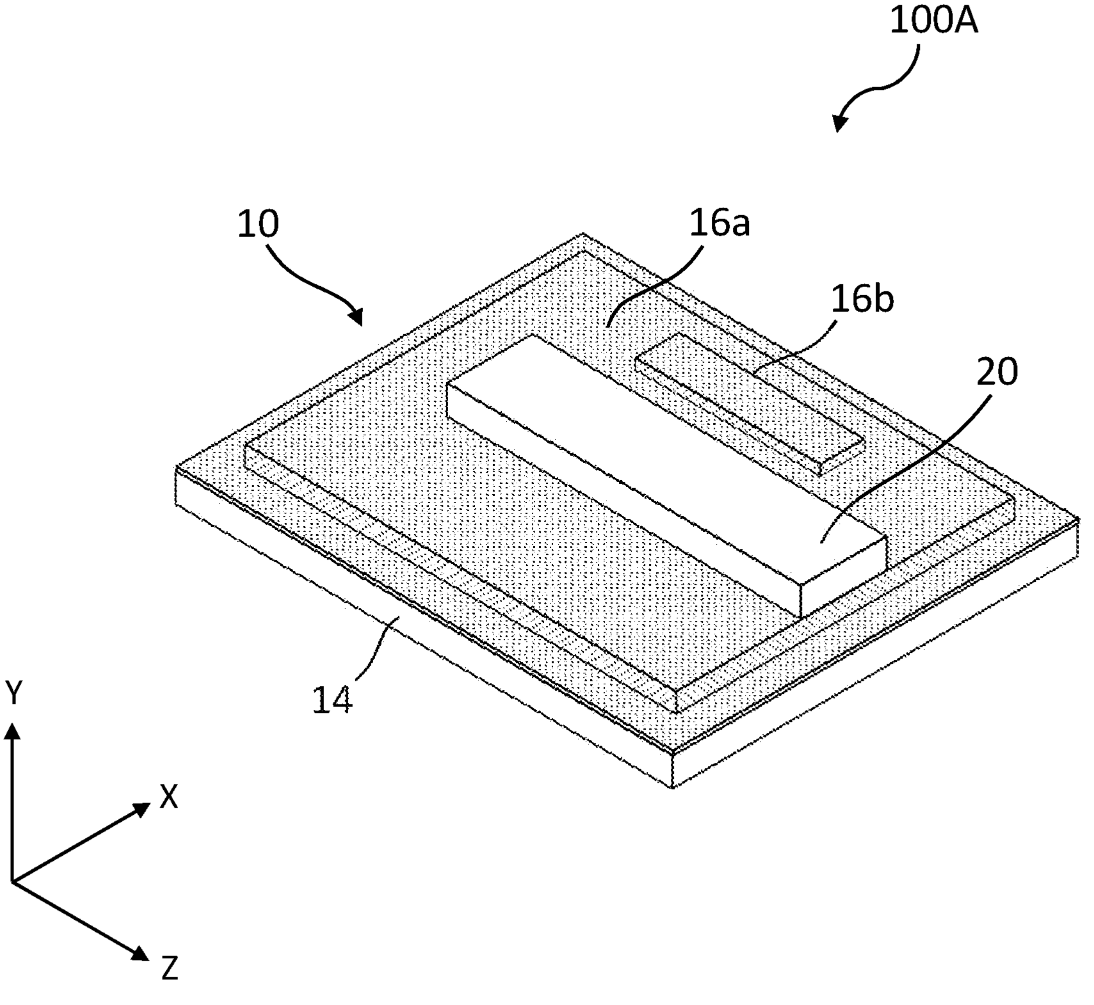
FIG. 2A schematically illustrates a perspective view of the light emitting device shown in FIG. 1B in more detail, omitting a package, lead terminals, and wires in the light emitting device.

FIG. 2A schematically illustrates a perspective view of the the light emitting device 100 shown in FIG. 1B in more detail, omitting the package 30, the lead terminals 40, and the wires 40*w* in the light emitting device 100. The light emitting device 100A shown in FIG. 2A includes the submount 10 and the semiconductor laser device 20 that is provided on the submount 10. Although the example shown in FIG. 2A illustrates there being one semiconductor laser device 20 provided on the submount 10, a plurality of semiconductor laser devices 20 may be provided. The submount 10 includes: a support layer 14; a graphite layer (which does not show itself in the outer appearance) that is supported by the support layer 14; a first metal film 16*a* provided on the support layer 14 and the graphite layer; and a second metal film 16*b* provided in a partial area on the first metal film 16*a*. The portion shown hatched in FIG. 2A represents the first metal film 16*a* and the second metal film 16*b*. Hereinafter, for ease of understanding, the drawings used to describe the configuration of the light emitting device 100A will not show the first metal film 16*a* and the second metal film 16*b*. Details of the first metal film 16*a* and the second metal film 16*b* will be described below.

Figure 2B:
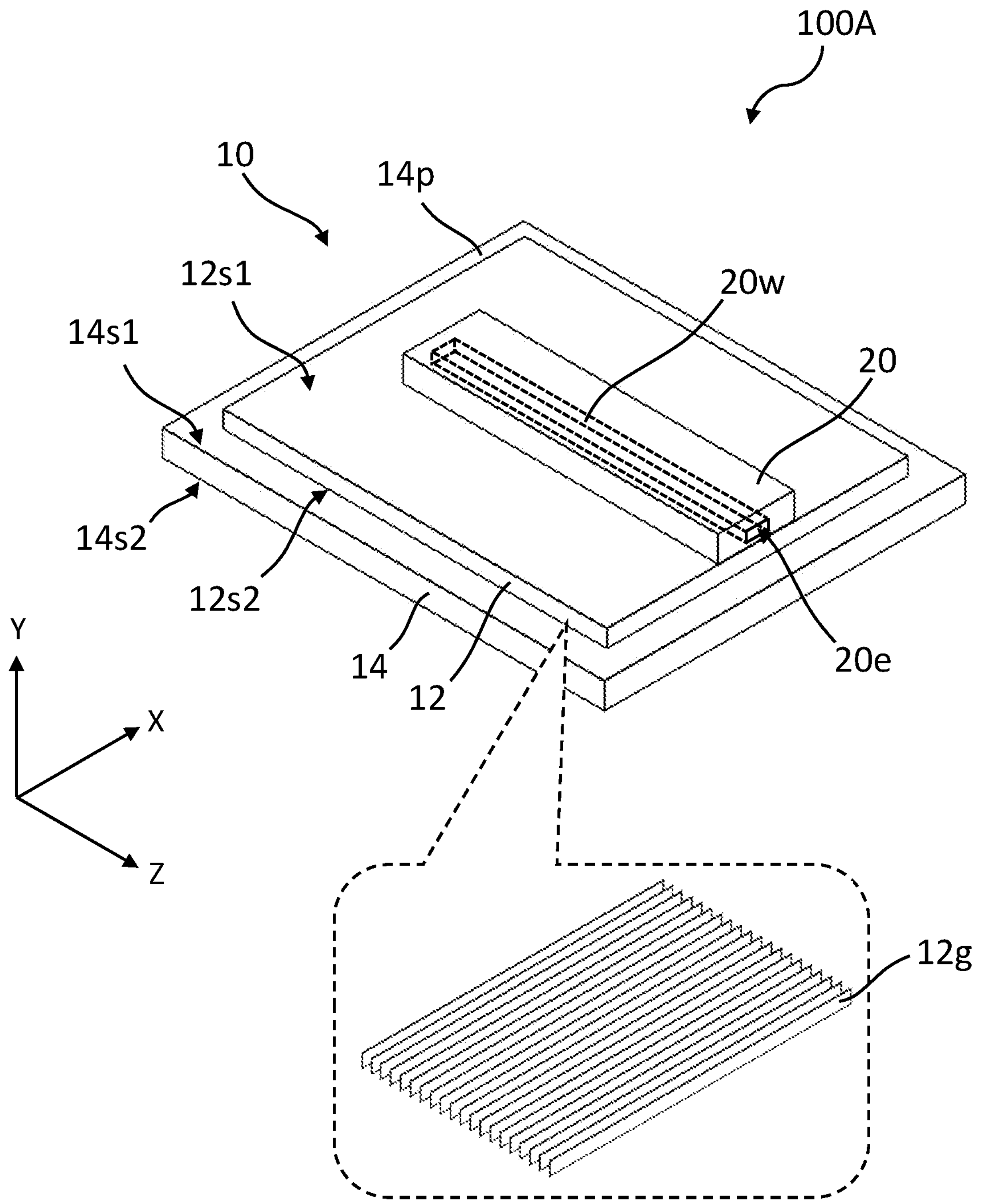
FIG. 2B schematically illustrates a perspective view of the light emitting device shown in FIG. 2A, omitting a first metal film and a second metal film.

FIG. 2B schematically illustrates a perspective view of the light emitting device 100A shown in FIG. 2A, omitting the first metal film 16*a* and the second metal film 16*b* in the light emitting device 100A. In the present specification, the light emitting device shown in FIG. 2B is also conveniently referred to as the “light emitting device 100A.” The semiconductor laser device 20 includes a waveguide 20*w* extending in the Z direction. Dotted lines depicted in FIG. 2B represent the waveguide 20*w*. When the semiconductor laser device 20 is in operation, light repeatedly reciprocating along the waveguide 20*w* emerges, until a portion of the light is emitted as laser light in the +Z direction from an end surface 20*e* at the +Z side. In the waveguide 20*w*, a current that is injected during operation flows in the narrow region defined by the waveguide 20*w*, which causes a high current density and hence a high thermal density (amount of generated heat per unit time/unit volume) within the waveguide 20*w*. Unless the heat generated in the waveguide 20*w* can be efficiently released outside, the thermal resistance (amount of temperature increase/amount of generated heat per unit time) will also be high. As a result of this, the laser light emitted from the semiconductor laser device 20 may experience a decrease in output power. In the light emitting device 100A according to the present embodiment, the submount 10 helps to suppress the temperature increase in the semiconductor laser device 20. Hereinafter, details of each component element included in the submount 10 will be described.

First, details of the graphite layer (shown as element 12 in FIG. 2B) will be described. The graphite layer 12 includes an upper surface 12*s*1 and a lower surface 12*s*2. Each of the upper surface 12*s*1 and the lower surface 12*s*2 of the graphite layer 12 extends in the X direction and the Z direction. The upper surface 12*s*1 of the graphite layer 12 supports the semiconductor laser device 20. As is schematically shown in an enlarged view (in an area surrounded by a broken line) in FIG. 2B, the graphite layer 12 includes a plurality of graphene structures 12*g* that are layered in the Z direction. Each of the plurality of graphene structures 12*g* extends within a plane that is perpendicular to the Z direction, and in the X direction, in the example illustrated in FIG. 2B. Each graphene structure 12*g* has a planar shape that is parallel to the XY plane, and has a honeycomb structure formed by covalent bonding of multiple carbon atoms in the plane. Two adjacent graphene structures 12*g* adjoining in the Z direction are bound together by van der Waals forces. Although the interval between two adjacent graphene structures 12*g* in the Z direction is very narrow, e.g., about 0.3 nm to 0.4 nm, the interval is shown exaggerated in the example of FIG. 2B. A method of manufacturing the graphite layer 12 will be described below.

Phonons are more dominant thermal conduction carriers in each graphene structure 12*g* than electrons. Heat is more likely to conduct within the plane of each graphene structure 12*g* than between two adjacent graphene structures 12*g*. Therefore, a very high thermal conductivity exists within the XY plane of the graphite layer 12, in contrast to a much lower thermal conductivity in the Z direction of the graphite layer 12. Specifically, a thermal conductivity of 1700 W/mK exists within the XY plane of the graphite layer 12, while a thermal conductivity of 7 W/mK exists in the Z direction. Thus, the graphite layer 12 has high anisotropy with respect to thermal conductivity.

Figure 3A:
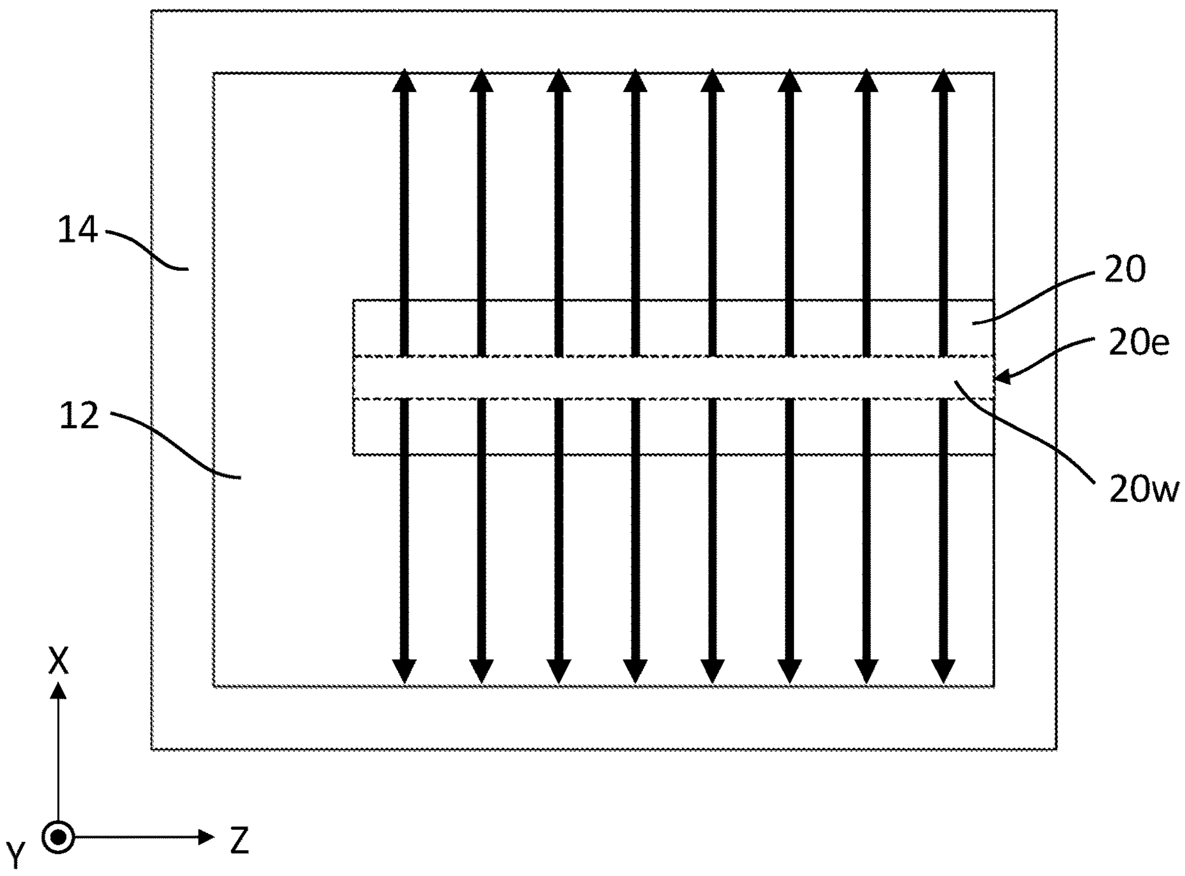
FIG. 3A schematically illustrates a top view of the light emitting device shown in FIG. 2B.
Figure 3B:
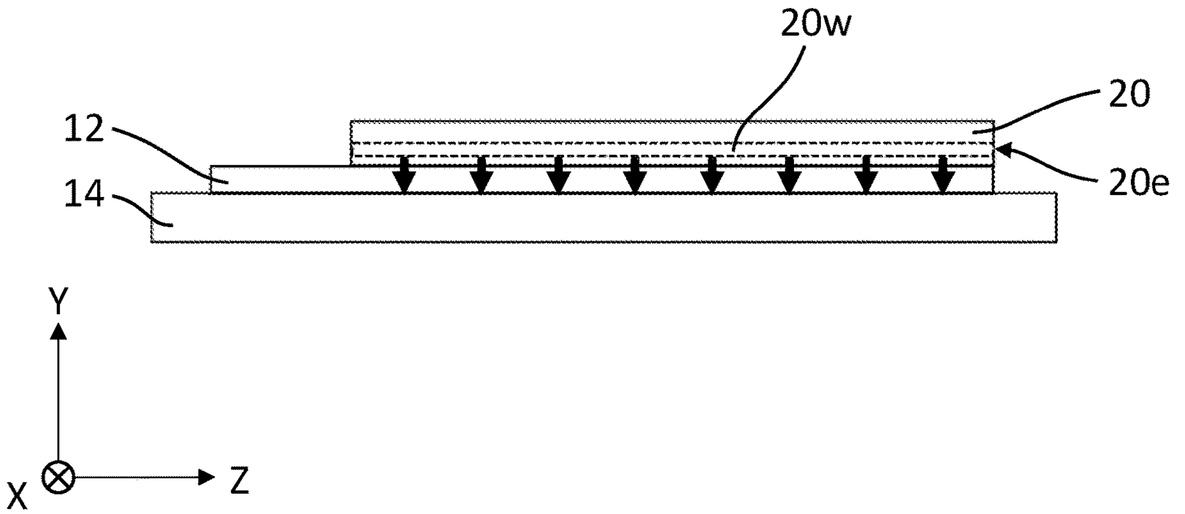
FIG. 3B schematically illustrates a side view of the light emitting device shown in FIG. 2B.

Next, with reference to FIG. 3A and FIG. 3B, it will be described how heat emitted from the semiconductor laser device 20 may diffuse in the graphite layer 12. FIG. 3A and FIG. 3B illustrate, respectively, a top view and a side view of the light emitting device 100A shown in FIG. 2B. Bold arrows in FIG. 3A and FIG. 3B represent directions in which heat emitted from the waveguide 20*w* efficiently diffuses in the graphite layer 12.

As shown in FIG. 3A, heat emitted from the waveguide 20*w* efficiently diffuses in the ±X direction within the graphite layer 12, and as shown in FIG. 3B, also efficiently diffuses in the −Y direction within the graphite layer 12. This allows the thermal density in the waveguide 20*w* during operation to be efficiently reduced. Because the waveguide 20*w* extends in a direction that is perpendicular to the plane in which each graphene structure 12*g* has a high thermal conductivity, the thermal density in the waveguide 20*w* during operation can be efficiently reduced. A reduction of thermal density also results in a reduction in thermal resistance. In contrast, in any configuration in which the waveguide 20*w* extends in a direction that is perpendicular to the stacking direction (in which the plurality of graphene structures 12*g* have poorer thermal conductivity), it is more difficult to efficiently reduce the thermal density in the waveguide 20*w* during operation. In such a configuration, unlike in the example shown in FIG. 3A, heat generated by the waveguide 20*w* will not efficiently diffuse in a direction that is perpendicular to the direction in which the waveguide 20*w* extends when viewed from the +Y direction, i.e., in a top view.

In the present embodiment, the direction in which the waveguide 20*w* extends does not need to be strictly perpendicular to the plane of each graphene structure 12*g*. The angle between the direction in which the waveguide 20*w* extends and the plane of each graphene structure 12*g* may be e.g. not less than 80° and not more than 90°. Similarly, the end surface 20*e* of the semiconductor laser device 20 does not need to be strictly perpendicular to the stacking direction of the plurality of graphene structures 12*g*. The end surface 20*e* of the semiconductor laser device 20 intersects the stacking direction of the plurality of graphene structures 12*g*, and the angle between the end surface 20*e* of the semiconductor laser device 20 and the stacking direction of the plurality of graphene structures 12*g* may be e.g. not less than 80° and not more than 90°.

Next, details of the support layer 14 will be described. The support layer 14 has an upper surface 14*s*1 and a lower surface 14*s*2. Each of the upper surface 14*s*1 and the lower surface 14*s*2 of the support layer 14 extends in the X direction and the Z direction. The upper surface 14*s*1 of the support layer 14 supports the lower surface 12*s*2 of the graphite layer 12. The graphite layer 12 is provided in a portion of the upper surface 14*s*1 of the support layer 14, rather than on the entire upper surface 14*s*1. In a top view, the support layer 14 has a peripheral portion 14*p* located outside of the perimeter of the graphite layer 12. The peripheral portion 14*p* makes it less likely for foreign objects to come in contact with the fragile graphite layer 12. The width of the peripheral portion 14*p* in a top view may be e.g. not less than 5 μm and not more than 100 μm.

The support layer 14 has a rigidity greater than that of the graphite layer 12. Moreover, the thickness of the support layer 14 is greater than the thickness of the graphite layer 12. Because the rigid and thick support layer 14 supports the fragile graphite layer 12, the mechanical strength of the submount 10 can be improved. The dimension of the graphite layer 12 in the Y direction (i.e., thickness) may be e.g. not less than 10 μm and not more than 200 μm. The thickness of the support layer 14 may be e.g. not less than 50 μm and not more than 300 μm. The largest thickness of the submount 10 is equal to a sum of the thickness of the graphite layer 12, the thickness of the support layer 14, the thickness of the first metal film 16*a*, and the thickness of the second metal film 16*b*. The largest dimension of the submount 10 in the X direction may be e.g. not less than 0.3 mm and not more than 4 mm, and the largest dimension of the submount 10 in the Z direction may be e.g. not less than 0.3 mm and not more than 5 mm.

The thermal conductivity of the support layer 14 is not as high as the thermal conductivity of the graphite layer 12 within the XY plane, but is relatively high, e.g., not less than 100 W/·K and not more than 800 W/m·K. The lower surface 14*s*2 of the support layer 14 is in thermal contact with the upper surface of the member 30*m* shown in FIG. 1B. The member 30*m* may function as a heat sink member. The support layer 14 allows the heat that propagates from the waveguide 20*w* to the graphite layer 12 to efficiently propagate to the member 30*m* of the base 30*b*.

In the case where the member 30*m* is electrically conductive, making the support layer 14 also electrically conductive will allow the semiconductor laser device 20 to be in electrical conduction with the member 30*m*, thus making it difficult to efficiently supply power to the semiconductor laser device 20. On the other hand, an electrically insulative support layer 14 can suppress electrical conduction between the semiconductor laser device 20 and the member 30*m*. When the member 30*m* is electrically insulative, the support layer 14 may be electrically conductive, or electrically insulative.

The support layer 14 may be made of ceramics, including at least one selected from the group consisting of AlN, SiC, silicon nitride, and aluminum oxide, for example. The ceramic may be an LTCC (Low Temperature Co-fired Ceramic), for example. Alternatively, the support layer 14 may be made of metals, including at least one selected from the group consisting of Ag, Cu, W, Au, Ni, Pt, and Pd, or an alloy thereof.

Next, details of the first metal film 16*a* and the second metal film 16*b* shown in FIG. 2A will be described. The first metal film 16*a* is provided on the entire upper surface of the peripheral portion 14*p*, and on the entire upper surface 12*s*1 of the graphite layer 12 and the entire lateral surfaces as shown in FIG. 2B. The first metal film 16*a* helps in bonding together the submount 10 and the semiconductor laser device 20 via an inorganic bonding member that is solderable, brazeable, or sinterable. Furthermore, the first metal film 16*a* helps in supplying power to the semiconductor laser device 20 via the wires 40*w* shown in FIG. 1B.

The first metal film 16*a* may be made of at least one metal selected from the group consisting of Ti, Pt, and Au, for example. In the case of soldering, the inorganic bonding member may be made of at least one alloy selected from the group consisting of AuSn, SnCu, SnAg, and SnAgCu, for example. In the case of brazing, the inorganic material may be made of at least one alloy selected from the group consisting of gold brazing materials, silver brazing materials, and copper brazing materials, for example. In the case of sintering, the inorganic bonding member may be made of a metal paste containing particles of at least one kind selected from the group consisting of Ag particles, Cu particles, and Au particles, for example.

Preferably, the first metal film 16*a* is thin in order to efficiently propagate heat emitted from the semiconductor laser device 20 to the graphite layer 12. The thickness of the first metal film 16*a* may be e.g. not less than 0.05 μm and not more than 2 μm. The first metal film 16*a* may be a single-layer film or a multilayer film.

The second metal film 16*b* is provided in a partial area on the first metal film 16*a*. If the wires 40*w* shown in FIG. 1B were to be ultrasonic bonded to the first metal film 16*a*, the thin first metal film 16*a* would allow ultrasonic waves to be absorbed by the graphite layer 12, which has low rigidity. Absorption of ultrasonic waves by the graphite layer 12 might make it difficult for the wires 40*w* to be bonded to the first metal film 16*a*. On the other hand, the second metal film 16*b* provided in a partial area on the first metal film 16*a* allows the wires 40*w* to be successfully ultrasonic bonded to the second metal film 16*b* because the addition of the second metal film 16*b* to the first metal film 16*a* makes it less likely for the ultrasonic waves to be absorbed by the graphite layer 12. The thickness of the second metal film 16*b* for being able to suppress absorption of ultrasonic waves by the graphite layer 12 may be e.g. not less than 5 μm and not more than 100 μm. The material of the second metal film 16*b* may be the same as the material of the first metal film 16*a*, for example. The second metal film 16*b* may be a single-layer film or a multilayer film.

A metal film is also provided on the upper surface of the semiconductor laser device 20. The metal film helps in supplying power to the semiconductor laser device 20 via the wires 40*w*.

Figure 4A:
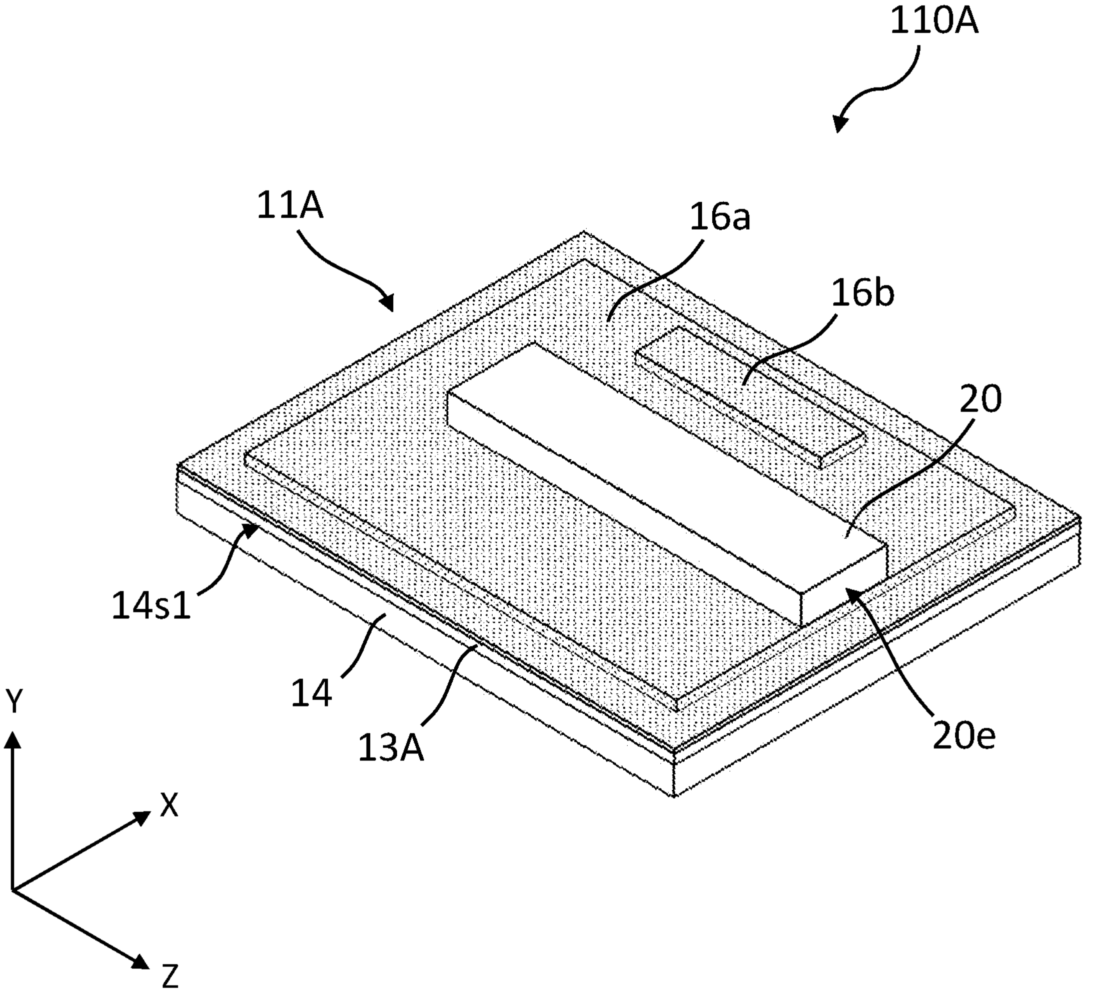
FIG. 4A schematically illustrates a perspective view of a light emitting device according to a first modified example of an embodiment of the present disclosure.
Figure 4B:
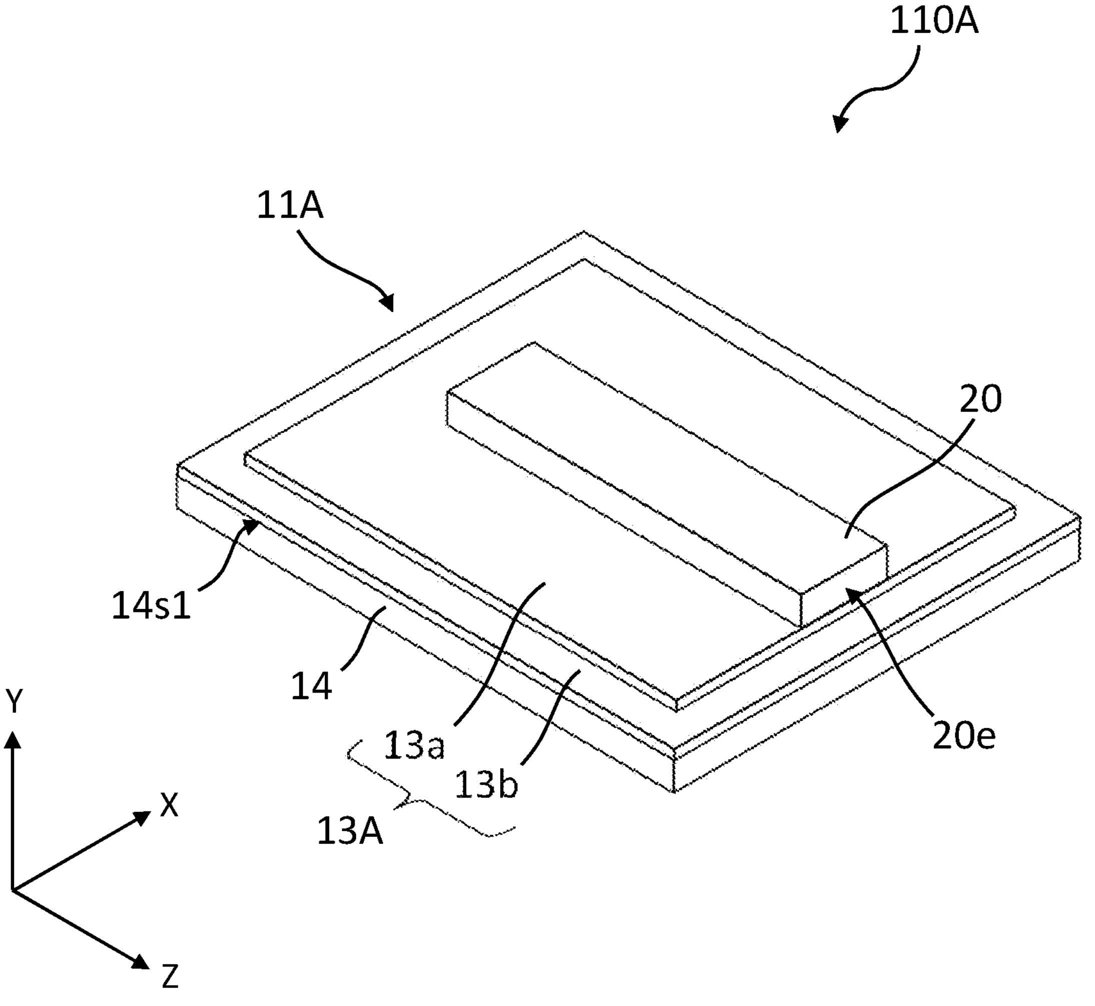
FIG. 4B schematically illustrates a perspective view of the light emitting device shown in FIG. 4A, omitting a first metal film and a second metal film in the light emitting device.

Next, with reference to FIG. 4A to FIG. 4C, modified examples of the light emitting device 100A according to the above embodiment of the present disclosure will be described. FIG. 4A schematically illustrates a perspective view of a light emitting device according to a first modified example of the embodiment of the present disclosure. The light emitting device 110A shown in FIG. 4A includes a submount 11A and a semiconductor laser device 20. The submount 11A includes a graphite layer 13A, a support layer 14, a first metal film 16*a*, and a second metal film 16*b*. FIG. 4B schematically illustrates a perspective view of the light emitting device 110A shown in FIG. 4A, omitting the first metal film 16*a* and the second metal film 16*b* in the light emitting device 110A shown in FIG. 4A. In the present specification, the light emitting device shown in FIG. 4B is also conveniently referred to as the "light emitting device 110A." The light emitting device 110A shown in FIG. 4B differs from the light emitting device 100A shown in FIG. 2B in that the graphite layer 13A is provided on the entire upper surface 14*s*1 of the support layer 14, and that portions of the graphite layer 13A other than the peripheral portion are raised.

The graphite layer 13A includes: a main portion 13*a* having an upper surface and a lower surface; and a flange portion 13*b* being located around the main portion 13*a* and having an upper surface and a lower surface. The upper surface of the graphite layer 13A includes both the upper surface of the main portion 13*a* and the upper surface of the flange portion 13*b*. The lower surface of the graphite layer 13A includes both the lower surface of the main portion 13*a* and the lower surface of the flange portion 13*b*. The first metal film 16*a* shown in FIG. 4A is provided on the upper surface of the graphite layer 13A. The upper surface of the main portion 13*a* supports the semiconductor laser device 20 via the first metal film 16*a*. In a top view, the second metal film 16*b* shown in FIG. 4A overlaps the main portion 13*a*.

The lower surface of the main portion 13*a* and the lower surface of the flange portion 13*b* are located in the same plane, that is, flush with each other, and are located on the upper surface 14*s*1 of the support layer 14. Relative to the upper surface 14*s*1 of the support layer 14, the upper surface of the flange portion 13*b* is at a lower position than is the upper surface of the main portion 13*a*. The thickness of the flange portion 13*b* is smaller than the thickness of the main portion 13*a*. The thickness of the flange portion 13*b* may be e.g. not less than 0.1 times the thickness of the main portion 13*a* and not more than 0.6 times the thickness of the main portion 13*a*. The thickness of the main portion 13*a* may be equal to the aforementioned thickness of the graphite layer 12, for example. In the light emitting device 110A according to the first modified example, the support layer 14 does not need to have the peripheral portion 14*p* as shown in FIG. 2B because the flange portion 13*b* serves to protect the main portion 13*a*.

Figure 4C:
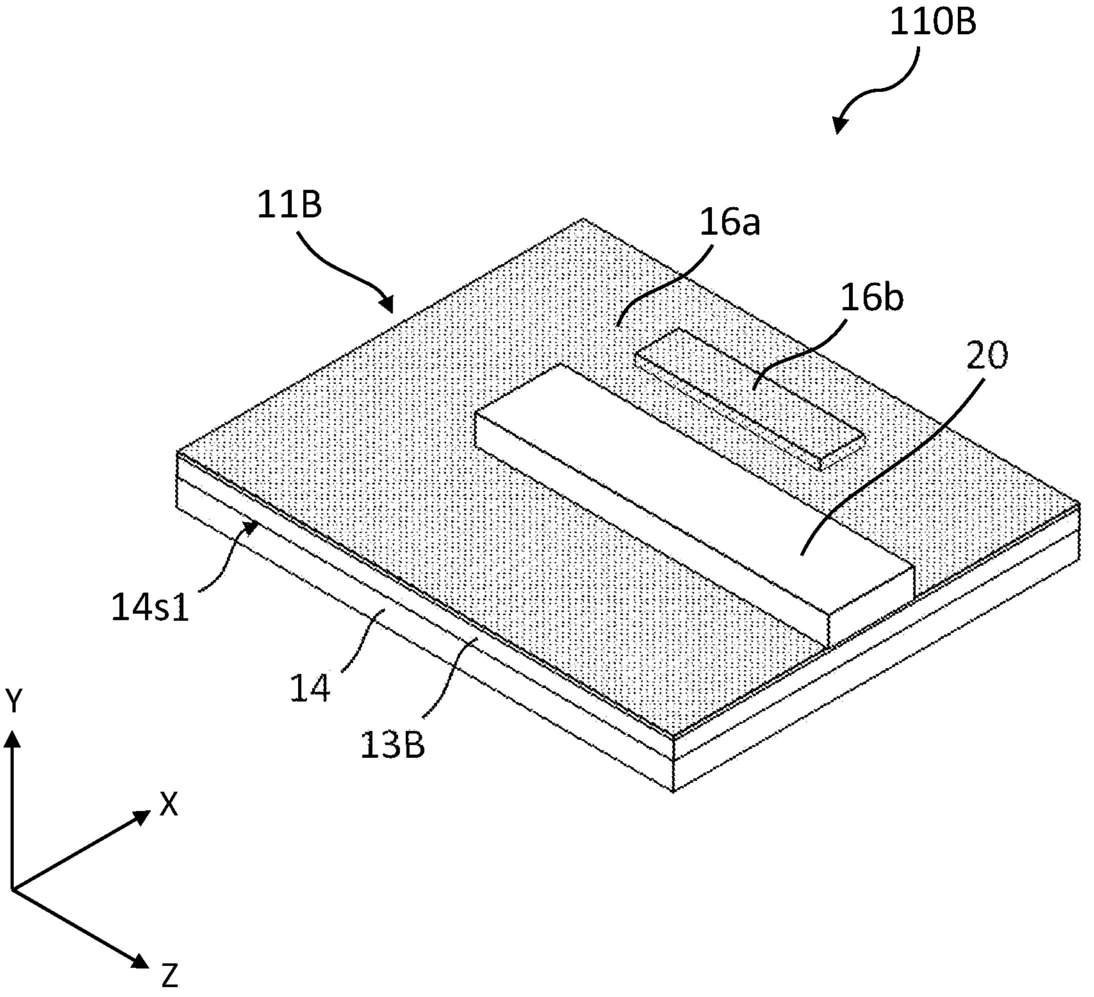
FIG. 4C schematically illustrates a perspective view of a light emitting device according to a second modified example of an embodiment of the present disclosure.

FIG. 4C schematically illustrates a perspective view of a light emitting device according to a second modified example of an embodiment of the present disclosure. The light emitting device 110B shown in FIG. 4C includes a submount 11B and a semiconductor laser device 20. The submount 11B includes a graphite layer 13B, a support layer 14, a first metal film 16*a*, and a second metal film 16*b*. The light emitting device 110B shown in FIG. 4C differs from the light emitting device 100A shown in FIG. 2A in that the graphite layer 13B is provided on the entire upper surface 14*s*1 of the support layer 14 and that the graphite layer 13B has a shape of an entirely flat plate extending along the XZ plane. When the graphite layer 13B does not need to be protected, the support layer 14 does not need to include the peripheral portion 14*p* shown in FIG. 2B. In the light emitting device 110B according to the second modified example, the broader graphite layer 13B allows the semiconductor laser device 20 to be located farther to the +Z side on the submount 11B.

With the light emitting device 100A according to the present embodiment and the light emitting devices 110A and 110B according to modified examples thereof, an excessive temperature increase in the semiconductor laser device 20 can be suppressed. With the light emitting devices 100A, 110A and 110B, a decrease in the output power of laser light can be suppressed not only when the laser light emitted from the semiconductor laser device 20 has a low output power, but also when the laser light has an output power as high as 10 W or more and 100 W or less. A light emitting device with a high output power can be used in a processing machine or a projector, for example.

Method of Manufacturing Light Emitting Device

Hereinafter, a method of manufacturing a light emitting device according to an embodiment of the present disclosure will be described. The method of manufacturing a light emitting device involves a step of processing a stack (sized e.g. 10 mm×10 mm to 50 mm×50 mm) in which a support layer and a graphite sheet are layered, and singulating the stack into a plurality of submounts 10. The number of submounts 10 to be obtained through singulation may be on the order of $10^2$ to $10^3$, for example.

First, with reference to FIG. 5A and FIG. 5B, a method of manufacturing a graphite sheet will be described. Each of FIG. 5A and FIG. 5B is a diagram for describing an example step in the method of manufacturing a graphite sheet.

Figure 5A:
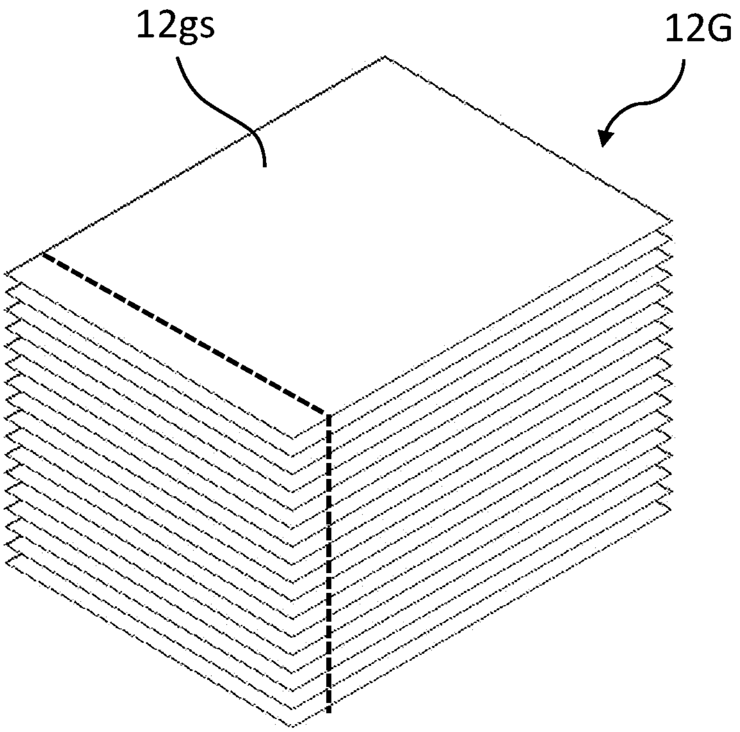
FIG. 5A is a diagram for describing an example step in a method of manufacturing a graphite sheet.

In a first step, as shown in FIG. 5A, graphite 12G is formed by chemical vapor deposition, for example. The graphite 12G includes a plurality of graphene sheets 12*gs* which are layered in the vertical direction. Each of the plurality of graphene sheets 12*gs* has a two-dimensional planar shape. Similarly to each graphene structure 12*g* shown in FIG. 2B, each graphene sheet 12*gs* has a honeycomb structure formed by covalent bonding of multiple carbon atoms. Two adjacent graphene sheets 12*gs* are bound together by van der Waals forces, as are two adjacent graphene structures 12*g* shown in FIG. 2B. As the graphite 12G, for example, PYROID HT (highly oriented graphite manufactured by MINTEQ International Inc., USA) can be used.

Figure 5B:
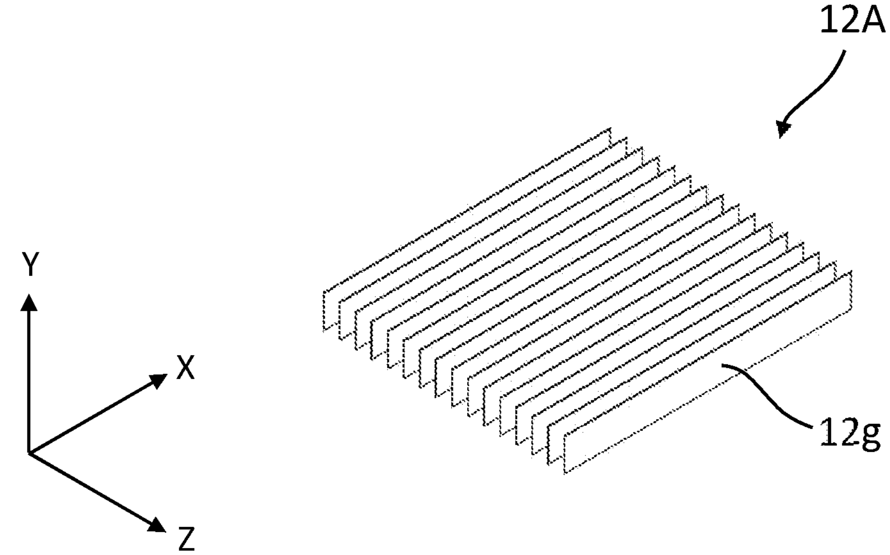
FIG. 5B is a diagram for describing an example step in a method of manufacturing a graphite sheet.

In a next step, an end of the graphite 12G shown in FIG. 5A is sliced off along a broken line, whereby a graphite sheet 12A as shown in FIG. 5B is formed. Note, however, that the orientation of the graphite sheet 12A as shown in FIG. 5B is different from the orientation of the sliced end of the graphite 12G as shown in FIG. 5A. The graphite sheet 12A extends in the X direction and the Z direction. The graphite sheet 12A includes a plurality of graphene structures 12*g*, which are layered in the Z direction and each of which extends in the X direction. The thickness of the graphite sheet 12A may be e.g. not less than 100 μm and not more than 3000 μm.

Next, with reference to FIG. 6A to FIG. 6E, a method of manufacturing the submount 10 according to an embodiment of the present disclosure will be described. Each of FIG. 6A to FIG. 6E is a diagram for describing an example step in the method of manufacturing the submount 10 according to an embodiment of the present disclosure.

Figure 6A:
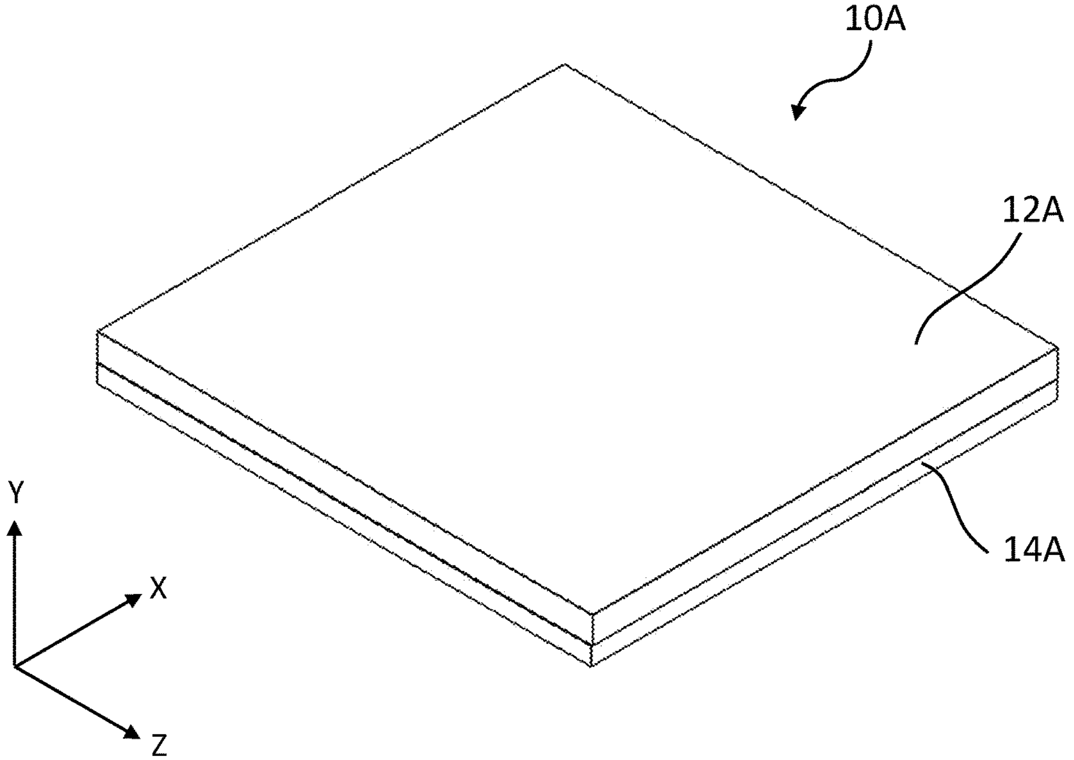
FIG. 6A is a diagram for describing an example step in a method of manufacturing a submount according to an embodiment of the present disclosure.

In a first step, as shown in FIG. 6A, a stack 10A is provided in which the graphite sheet 12A and the support layer 14A are layered. Unlike the graphite sheet 12A shown in FIG. 5B, the graphite sheet 12A shown in the FIG. 6A is depicted as a flat plate. Similarly to the graphite sheet 12A, the support layer 14A extends in the X direction and the Z direction. The graphite sheet 12A and the support layer 14A are attached together through room temperature bonding, for example. Specifically, each of the lower surface of the graphite sheet 12A and the upper surface of the support layer 14A is polished, and the lower surface of the graphite sheet 12A and the upper surface of the support layer 14A having been polished are bonded together at room temperature by intermolecular forces. In room temperature bonding, no bonding member is needed. At this step, the thickness of the graphite sheet 12A is greater than the thickness of the support layer 14A.

Figure 6B:
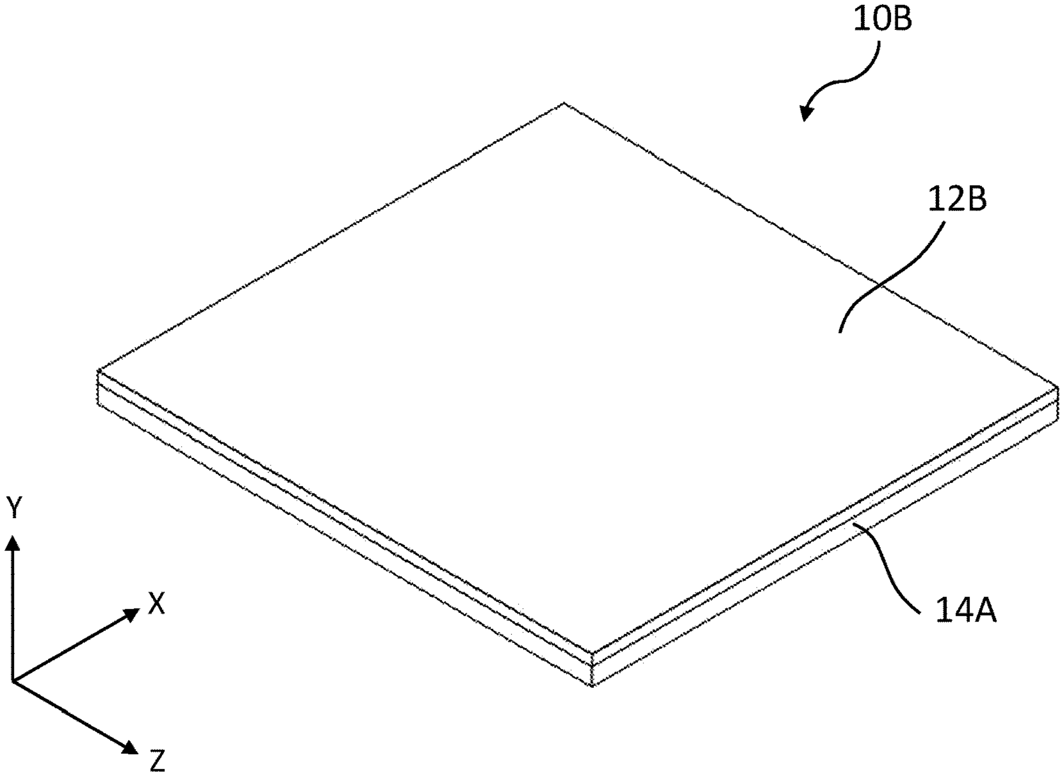
FIG. 6B is a diagram for describing an example step in a method of manufacturing a submount according to an embodiment of the present disclosure.

In a next step, the upper surface of the graphite sheet 12A shown in FIG. 6A is polished in order to make the graphite sheet 12A thinner than the support layer 14A, whereby a graphite layer 12B is formed as shown in FIG. 6B. In the stack 10B shown in FIG. 6B, the graphite layer 12B and the support layer 14A are layered. The rigidity of the support layer 14A is higher than that of the graphite layer 12B, and the thickness of the support layer 14A is greater than that of the graphite layer 12B. Because the rigid and thick support layer 14A supports the fragile graphite layer 12B, the mechanical strength of the stack 10B can be improved. The thickness of the graphite layer 12B is equal to the thickness of the graphite layer 12 shown in FIG. 2B. The thickness of the support layer 14A is equal to the thickness of the support layer 14 shown in FIG. 2B. The material of the support layer 14A is the same as the material of the support layer 14 shown in FIG. 2B.

Figure 6C:
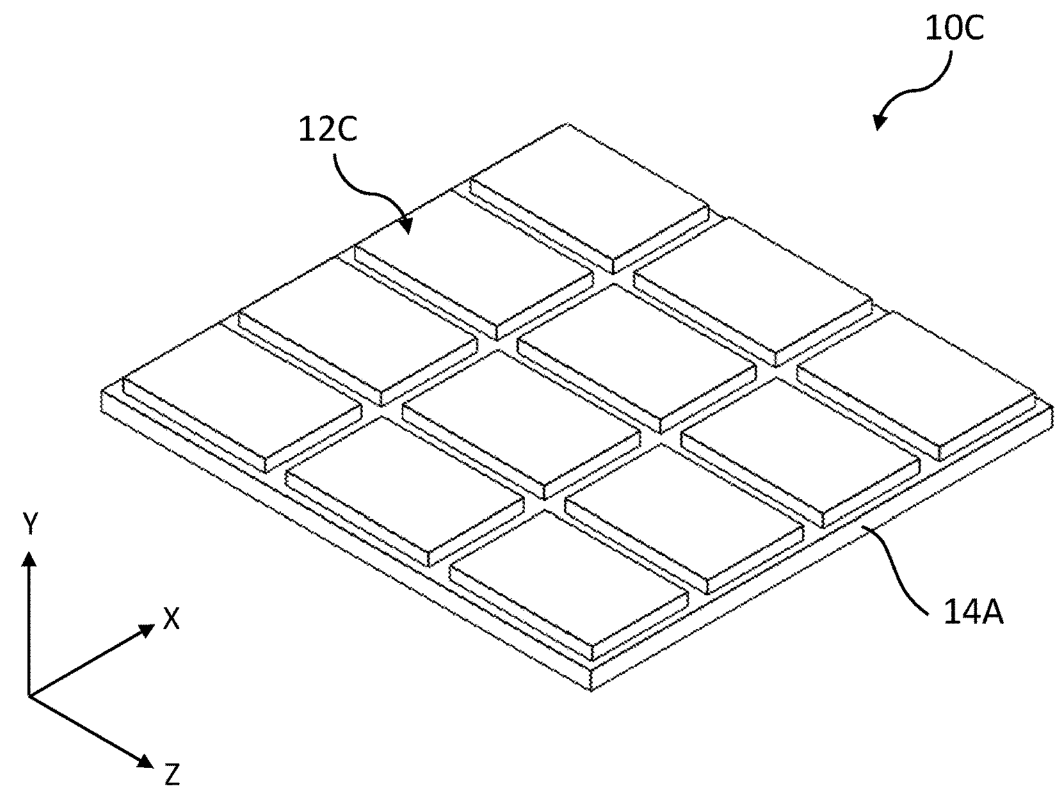
FIG. 6C is a diagram for describing an example step in a method of manufacturing a submount according to an embodiment of the present disclosure.

In a next step, as shown in FIG. 6C, a plurality of grooves are formed in the graphite layer 12B in the stack 10B shown in FIG. 6B, such that each groove extends in the X direction or the Z direction. As the plurality of grooves are formed, portions of the surface of the support layer 14A become exposed. In the stack 10C shown in FIG. 6C, a graphite layer 12C having the grooves formed therein and the support layer 14A are layered. The grooves may be formed by patterning the graphite layer 12B in a lattice shape through etching, for example. Forming the plurality of grooves through etching will make it less likely for the graphite layer 12C to have burrs than if the plurality of grooves are formed by using a blade. In the case where burrs on the graphite layer 12C may be tolerated, a blade may be used in forming the grooves.

Figure 6D:
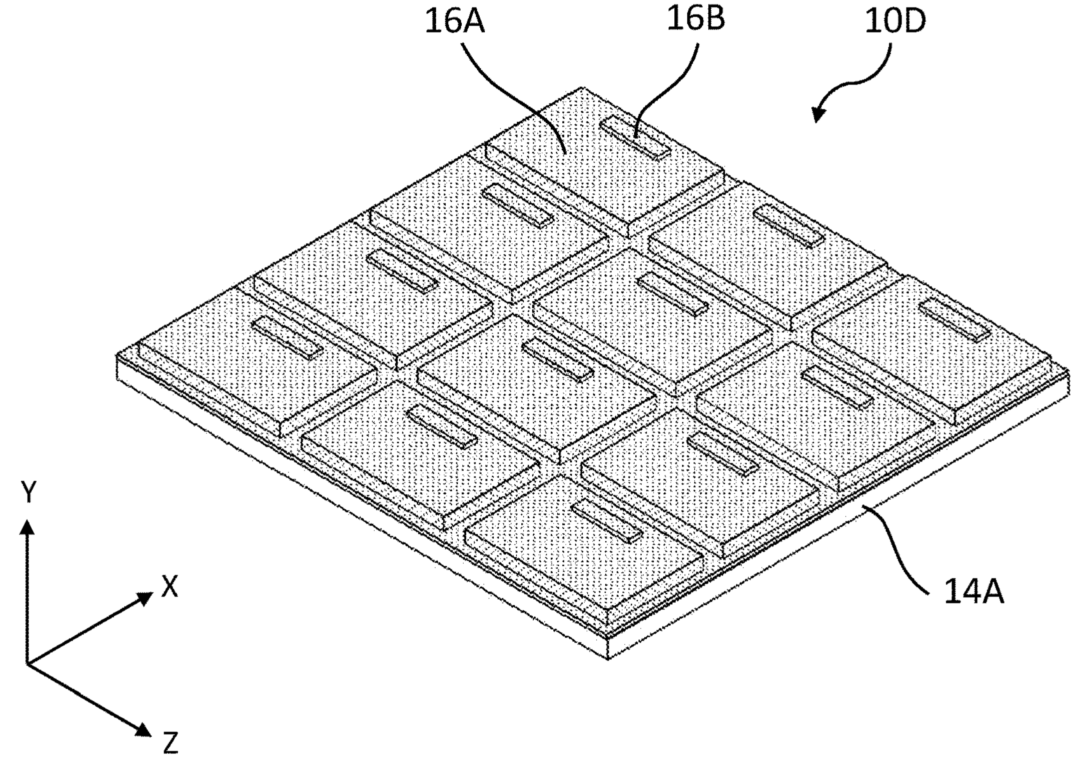
FIG. 6D is a diagram for describing an example step in a method of manufacturing a submount according to an embodiment of the present disclosure.

In a next step, on the upper surface of the stack 10C shown in FIG. 6C, i.e., on the upper surface and lateral surfaces of the graphite layer 12C and on the exposed surface of the support layer 14A, a first metal film 16A is formed as shown in FIG. 6D. The first metal film 16A may be formed by sputtering, vapor deposition, or plating, for example. Furthermore, a plurality of second metal films 16B are formed in partial areas of the first metal film 16A, the plurality of second metal films 16B being arrayed in the X direction and the Z direction. The plurality of second metal films 16B may be formed by, for example, providing a metal film on the entire upper surface of the first metal film 16A and then patterning the metal film. Each second metal film 16B is to be provided in each one of the portions of the first metal film 16A that are delimited by the plurality of grooves. A stack 10D shown in FIG. 6D includes: the stack 10C shown in FIG. 6C; the first metal film 16A; and the second metal films 16B. The materials of the first metal film 16A and the second metal films 16B are the same as the materials of the first metal film 16*a* and the second metal film 16*b* shown in FIG. 2A, respectively. The thicknesses of the first metal film 16A and each second metal film 16B are equal to the thicknesses of the first metal film 16*a* and the second metal film 16*b* shown in FIG. 2A, respectively.

Figure 6E:
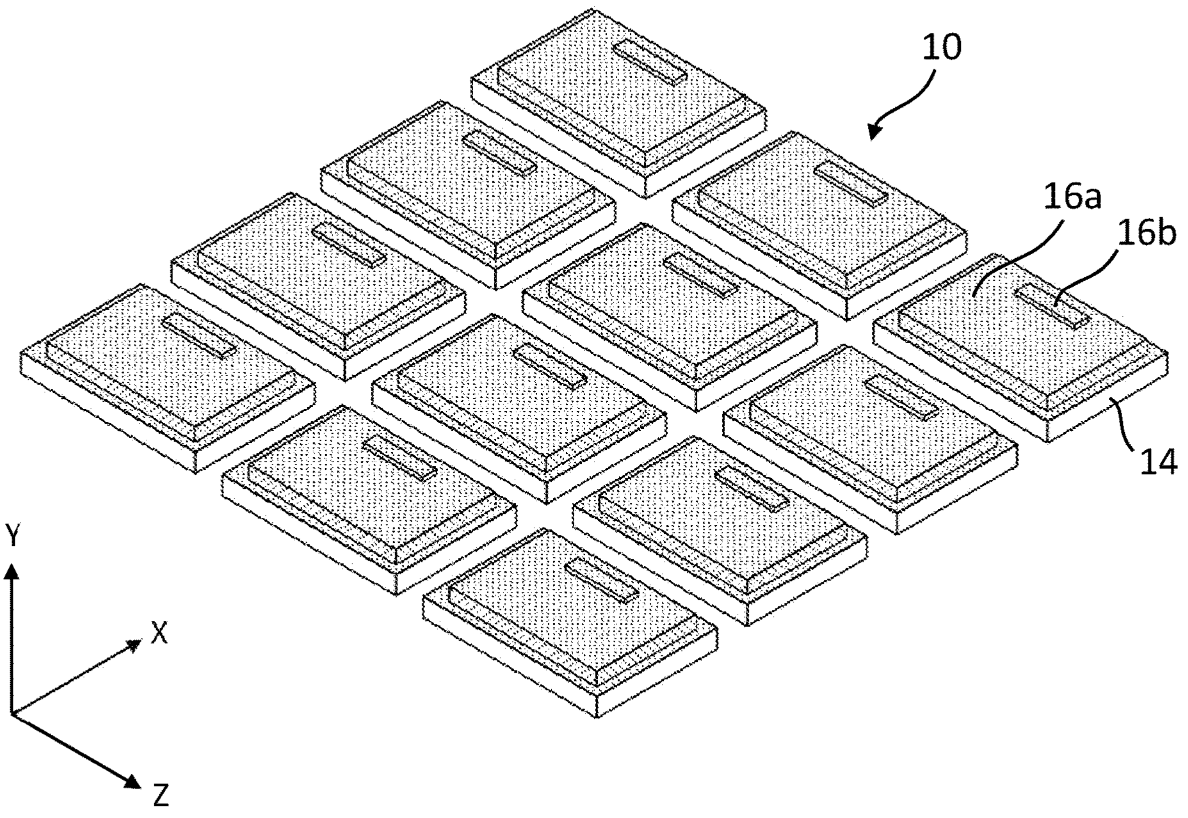
FIG. 6E is a diagram for describing an example step in a method of manufacturing a submount according to an embodiment of the present disclosure.

In a next step, as shown in FIG. 6E, the stack 10C shown in FIG. 6D are singulated into a plurality of submounts 10 along the plurality of grooves. The singulation is performed by cutting with a blade, for example. Each submount 10 includes a portion of the graphite layer 12C shown in FIG. 6C, as well as a portion of the support layer 14A, a portion of the first metal film 16A, and the corresponding second metal film 16B shown in FIG. 6D. The portion of the graphite layer 12C corresponds to the graphite layer 12 shown in FIG. 2B, whereas the portion of the support layer 14A corresponds to the support layer 14 shown in FIG. 2B. The portion of the first metal film 16A corresponds to the first metal film 16*a* shown in FIG. 2A, whereas the second metal film 16B corresponds to the second metal film 16*b* shown in FIG. 2A.

Because singulation is carried out along the plurality of grooves, the graphite layer 12C is not cut. Therefore, no burrs associated with cutting of the graphite layer 12C will occur. However, some burrs may still occur as a result of cutting the first metal film 16A. Even if such burrs occur, however, as shown in FIG. 2A, such burrs are less likely to hinder the travel of the laser light emitted from the semiconductor laser device 20 because the semiconductor laser device 20 is placed on the raised portion of the submount 10.

The above steps described with reference to FIG. 6A to FIG. 6E produce the submount 10 according to the present embodiment. The method of manufacturing the light emitting device 100A according to the present embodiment includes, after the method of manufacturing the submount 10 according to the present embodiment, a step of providing the semiconductor laser device 20 via the first metal film 16*a* onto the graphite layer 12 that is included in the submount 10.

Unlike in the example shown in FIG. 6C, a plurality of grooves may be formed in such a manner that portions of the surface of the support layer 14A are not exposed, in the X direction and the Z direction in the graphite layer 12B in the stack 10B shown in FIG. 6B. On the graphite layer having such grooves, the first metal film 16A and the plurality of second metal films 16B shown in FIG. 6D may be formed. Through singulation of the resultant stack along the plurality of grooves, the submount 11A according to the first modified example of the present embodiment (shown in FIG. 4A) can be produced. Burrs may occur as a result of cutting of the graphite layer and the first metal film 16A. Even if such burrs occur, as described above, such burrs are less likely to hinder the travel of the laser light emitted from the semiconductor laser device 20 because the semiconductor laser device 20 is placed on the raised portion of the submount 10.

Alternatively, grooves may not be formed altogether in the graphite layer 12B in the stack 10B shown in FIG. 6B. In other words, on the graphite layer 12B shown in FIG. 6B, the first metal film 16A and the plurality of second metal films 16B shown in FIG. 6D may be formed. Through singulation of the resultant stack in the X direction and the Z direction, the submount 11B according to the second modified example of the present embodiment (shown in FIG. 4C) can be produced. Burrs occurring as a result of cutting the graphite layer 12B and the first metal film 16A may hinder the travel of laser light emitted from the semiconductor laser device 20. The submount 11B according to the second modified example will work properly so long as such hindrance of the travel of laser light does not occur.

Next, the configurations of the semiconductor laser device 20 shown in FIG. 2A and FIG. 2B and the package 30 and the lead terminals 40 shown in FIG. 1A will be described.

Semiconductor Laser Device 20

The semiconductor laser device 20 may be a rectangular-parallelepiped, for example. The size of each semiconductor laser device 20 in the X direction is e.g. not less than 50 μm and not more than 500 μm, and preferably not less than 150 μm and not more than 500 μm. The size of each semiconductor laser device 20 in the Y direction is e.g. not less than 20 μm and not more than 150 μm. The size of each semiconductor laser device 20 size in the Z direction is e.g. not less than 50 μm and not more than 10 mm, and preferably not less than 1200 μm and not more than 4 mm.

The semiconductor laser device 20 is able to emit laser light of violet, blue, green, or red in the visible region, or infrared or ultraviolet laser light in the invisible region. The emission peak wavelength of violet is preferably 380 nm or greater and 419 nm or less, and more preferably 400 nm or greater and 415 nm or less. The emission peak wavelength of blue light is preferably 420 nm or greater and 494 nm or less, and more preferably 440 nm or greater and 475 nm or less. Examples of a semiconductor laser device to emit violet or blue laser light include a semiconductor laser device containing a nitride semiconductor material. Examples of nitride semiconductor materials include GaN, InGaN, and AlGaN. The emission peak wavelength of green light is preferably 495 nm or greater and 570 nm or less, and more preferably 510 nm or greater and 550 nm or less. Examples of a semiconductor laser device to emit green laser light include a semiconductor laser device containing a nitride semiconductor material. Examples of nitride semiconductor materials include GaN, InGaN, and AlGaN. The emission peak wavelength of red light is preferably 605 nm or greater and 750 nm or less, and more preferably 610 nm or greater and 700 nm or less. Examples of a semiconductor laser device to emit red laser light include a semiconductor laser device containing an InAlGaP-based, GaInP-based, GaAs-based, or AlGaAs-based semiconductor material.

The semiconductor laser device 20 includes a semiconductor multilayer structure in which a substrate, a first cladding layer, an emission layer, and a second cladding layer are layered in this order in the +Y direction or in the −Y direction. The conductivity type of the first cladding layer is one of the p type and the n type, whereas the conductivity type of the second cladding layer is the other one of the p type and the n type. The substrate may be a semiconductor substrate, for example. The semiconductor multilayer structure may not include a substrate. An electrode of the semiconductor laser device 20 that is electrically connected to the first cladding layer is referred to as the "first electrode," whereas an electrode of the semiconductor laser device 20 that is electrically connected to the second cladding layer is referred to as the "second electrode." By applying a forward voltage between the first electrode and the second electrode to flow a threshold current or greater, laser light is emitted from one of the two end surfaces of the emission layer in the Z direction, i.e., the end surface 20*e*. The laser light has some spread, and creates a far field pattern (hereinafter referred to as "FFP") of an elliptical shape at a surface that is parallel to the end surface 20*e*. Of this elliptical shape, for example, the major axis is parallel to the stacking direction in the semiconductor multilayer structure, whereas the minor axis is parallel to the direction in which end surface 20*e* extends. As laser light travels, it spreads relatively fast in the major axis direction and relatively slowly in the minor axis direction; therefore, the major axis and the minor axis are referred to as the fast axis and the slow axis, respectively.

A fast-axis collimating lens for reducing the spread of laser light in the fast-axis direction may be provided inside or outside the package 30 and yet on the optical path of laser light, for example. The same is also true of a slow-axis collimating lens for reducing the spread of laser light in the slow-axis direction. The fast-axis collimating lens is to be located between the semiconductor laser device 20 and the slow-axis collimating lens. Instead, a single collimating lens may be used to reduce the spread of laser light in both the fast-axis direction and the slow-axis direction.

The semiconductor laser device 20 may be mounted in a so-called face-up position, where the substrate is located closer to the submount 10 than is the emission layer in the semiconductor multilayer structure. Alternatively, the semiconductor laser device 20 may be mounted in a so-called face-down position, where the emission layer is located closer to the submount 10 than is the substrate in the semiconductor multilayer structure. Irrespective of whether the wavelength of the laser light is long or short, a face-down mounting allows heat emitted from the semiconductor laser device 20 to more efficiently propagate to the submount 10 than does a face-up mounting. In the case of face-down mounting, the semiconductor laser device 20 may be disposed on the submount 10 so that its tip end including the end surface 20*e* of the semiconductor laser device 20 protrudes from the graphite layer 12 or the support layer 14 in a top view. Such positioning will make it less likely for the graphite layer 12 or the support layer 14 to hinder the travel of a portion of the laser light.

Package 30

As shown in FIG. 1B, the base 30*b* of the package 30 serves to house the submount 10, the semiconductor laser device 20, and the wires 40*w*. The package 30 may hermetically seal these component elements. When the semiconductor laser device 20 emits laser light of 350 nm or greater and 570 nm or less, organic gas components and the like that are contained in the ambient may be decomposed by the laser light, so that the decomposed matter may adhere to the end surface 20*e* of the semiconductor laser device 20 shown in FIG. 2B. Moreover, if the end surface 20*e* of the semiconductor laser device 20 is in contact with the outside air, deterioration of the exiting surface may progress during operation due to dust attraction or the like. Such factors may lead to decrease in the output power of the laser light emitted from the semiconductor laser device 20. In order to enhance reliability of the semiconductor laser device 20 for extended operation life, it is preferable that the package 30 seals the semiconductor laser device 20 hermetically. Hermetic sealing by the package 30 may be conducted regardless of the wavelength of the laser light to be emitted from the semiconductor laser device 20.

The member 30*m* provided on the inner bottom surface 30*bt* of the base 30*b* allows the end surface 20*e* of the semiconductor laser device 20 and the window 30*w* to be aligned in height. The member 30*m* may be made of the same material as the bottom plate portion of the base 30*b* that includes the inner bottom surface 30*bt*. Alternatively, the member 30*m* may be at least a portion protruding from the inner bottom surface 30*bt* of the base 30*b*. The bottom plate portion of the base 30*b* that includes the inner bottom surface 30*bt* may be made of metals, including at least one selected from the group consisting of Cu, Al, Ag, Fe, Ni, Mo, Cu, W, and CuMo, for example. Such metals have high thermal conductivity, and a bottom plate portion made of such metals can efficiently propagate the heat emitted from the semiconductor laser device 20 during operation to the outside. Lateral wall portions of the base 30*b* surround the submount 10, the semiconductor laser device 20, and the wires 40*w*. The lateral wall portions may be made of kovar, for example. Kovar is an alloy in which nickel and cobalt are added to iron, which is a main component.

The lid 30L may be made of the same material as or a different material from that of the base 30*b*. The window 30*w* is attached to the base 30*b* in order to transmit laser light emitted from the semiconductor laser device 20. The material of the window 30*w* may be at least one light-transmissive material selected from the group consisting of glass, silicon, quartz, synthetic quartz, sapphire, transparent ceramics, and plastics, for example.

Lead Terminal 40

Through the lead terminals 40, a current is injected in the semiconductor laser device 20, whereby laser light is emitted from the semiconductor laser device 20. The lead terminals 40 are electrically connected to an external circuit that controls the emission timing and the output power of laser light emitted from the semiconductor laser device 20.

As shown in FIG. 1B, the lead terminals 40 are electrically connected to the semiconductor laser device 20 via the wires 40*w* and the submount 10. In the example shown in FIG. 1B, one of the lead terminals 40 is electrically connected via three wires 40*w* to a metal film (electrode) that is formed on the upper surface of the semiconductor laser device 20, while the other lead terminal 40 is electrically connected via three wires 40*w* to a metal film (second metal film 16*b* shown in FIG. 2A) provided on the upper surface of the submount 10. The number of wires 40*w* is not limited to three, but may be one or two, or four or more.

The lead terminals 40 may be made of an electrically conductive material such as an Fe—Ni alloy or a Cu alloy, for example. The wires 40*w* may be made of at least one metal selected from the group consisting of Au, Ag, Cu, and Al, for example.

A light emitting device, a method of manufacturing a light emitting device, and a method of manufacturing a submount according to the present disclosure can be used for processing machines, projectors, and illumination devices, for example.

What is claimed is:

1. A light emitting device comprising:

a submount including:

- a graphite layer having an upper surface and a lower surface that extend along a first direction and a second direction which are orthogonal to each other, wherein the graphite layer includes a plurality of graphene structures that are layered in the first direction, each of the plurality of graphene structures extending in the second direction, and
- a support layer having an upper surface and a lower surface that extend in the first direction and the second direction, the support layer being thicker than the graphite layer, the upper surface of the support layer supporting the lower surface of the graphite layer;

a semiconductor laser device configured to emit laser light through an end surface in the first direction, the semiconductor laser device including a waveguide that extends in the first direction and is supported by the upper surface of the graphite layer; and a base supporting the submount, wherein the graphite layer is provided on the entire upper surface of the support layer, the graphite layer includes a main portion having an upper surface and a lower surface and a flange portion around the main portion and having an upper surface and a lower surface, the upper surface of the main portion supports the semiconductor laser device, the lower surface of the main portion and the lower surface of the flange portion are flush with each other, and relative to the upper surface of the support layer, the upper surface of the flange portion is at a lower position than is the upper surface of the main portion.

2. The light emitting device of claim 1, wherein the graphite layer has a thickness not less than 10 μm and not more than 200 μm, and the support layer has a thickness not less than 50 μm and not more than 300 μm.

3. The light emitting device of claim 1, wherein the support layer is made of ceramic or metal.

4. The light emitting device of claim 3, wherein the support layer has a thermal conductivity of 100 W/m·K or more.

5. The light emitting device of claim 3, wherein the support layer is electrically insulative.

6. The light emitting device of claim 1, wherein the support layer includes a peripheral portion that is located outside of a perimeter of the graphite layer.

7. The light emitting device of claim 1, wherein side surfaces of the flange portion in the first direction are flush with side surfaces of the support layer in the first direction, respectively, and side surfaces of the flange portion in the second direction are flush with side surfaces of the support layer in the second direction, respectively.

8. The light emitting device of claim 1, wherein a thickness of the flange portion is not less than 0.1 times a thickness of the main portion and not more than 0.6 times the thickness of the main portion.

9. The light emitting device of claim 1, wherein the submount includes a first metal film provided on the upper surface of the graphite layer.

10. The light emitting device of claim 9, wherein the first metal film is provided on side surfaces of the graphite layer in the first direction and on side surfaces of the graphite layer in the second direction.

11. The light emitting device of claim 9, wherein the submount includes a second metal film provided in a partial area on the first metal film.

12. The light emitting device of claim 1, wherein the semiconductor laser device has a semiconductor multilayer structure including a substrate, a first cladding layer, an emission layer, and a second cladding layer that are layered in this order, and in the semiconductor multilayer structure, the emission layer is located closer to the graphite layer than is the substrate.

* * * * *